United States Patent [19]

Lawson et al.

[11] 3,802,885

[45] Apr. 9, 1974

[54] PHOTOSENSITIVE LITHOGRAPHIC NAPHTHOQUINONE DIAZIDE PRINTING PLATE WITH ALUMINUM BASE

[75] Inventors: Leslie Edward Lawson; Frank Edward Smith; Peter John Smith, all of Orpington, England

[73] Assignee: Algraphy Limited, Kent, England

[22] Filed: July 29, 1971

[21] Appl. No.: 167,438

Related U.S. Application Data

[63] Continuation of Ser. No. 785,782, Dec. 20, 1968, abandoned.

[52] U.S. Cl. .......................... 96/75, 96/33, 96/91 D

[51] Int. Cl. .......................................... G03f 7/08

[58] Field of Search ......... 96/91 D, 75, 49.33, 36.3, 96/36, 115 R

[56] References Cited

UNITED STATES PATENTS

| | | | |
|---|---|---|---|
| 3,634,082 | 1/1972 | Christensen | 96/91 D |
| 3,551,154 | 12/1970 | DiBias | 96/91 D |
| 3,495,979 | 2/1970 | Laridon et al. | 96/91 D X |
| 3,130,047 | 4/1964 | Uhlig et al. | 96/91 D X |
| 3,130,048 | 4/1964 | Fritz et al. | 96/91 D X |
| 3,050,387 | 8/1962 | Neugebauer et al. | 96/91 D X |
| 3,201,239 | 8/1965 | Neugebauer et al. | 96/91 D X |
| 3,106,465 | 10/1963 | Neugebauer et al. | 96/91 D X |
| 3,130,049 | 4/1964 | Neugebauer et al. | 96/91 D X |
| 3,264,104 | 8/1966 | Reichel | 96/91 D X |
| 3,402,044 | 9/1968 | Steinhoff et al. | 96/91 D |
| 3,046,112 | 7/1962 | Schmidt et al. | 96/91 D |
| 3,046,115 | 7/1962 | Schmidt et al. | 96/91 D X |
| 3,269,837 | 8/1966 | Sus | 96/91 D X |

FOREIGN PATENTS OR APPLICATIONS

| | | | |
|---|---|---|---|
| 769,670 | 10/1967 | Canada | 96/91 D |
| 852,496 | 10/1960 | Great Britain | 96/91 D |
| 1,170,458 | 11/1969 | Great Britain | 96/91 D |
| 1,034,191 | 6/1966 | Great Britain | 96/91 D |

*Primary Examiner*—Charles L. Bowers, Jr.

[57] ABSTRACT

A positive-acting printing plate having a coating containing a naphthoquinone-(1,2)-diazide-(2)-5-sulphonic acid derivative, the printing life of which has been improved by the inclusion of a polymeric carboxylic acid. Specific derivatives are 2,3,4-trihydroxy benzophenone tris- and 2,4-dihydroxy benzophenone bis-[naphthoquinone-(1,2)-diazide-(2)-5-sulphonate]. The coating includes a resin in particular an alkali-soluble novolak resin. The polymeric carboxylic acid is preferably present in an amount of 2 – 50 percent by weight based on the combined weight of said derivative and said resin. The invention makes possible the use of naphthoquinone-(1,2)-diazide-(2)-5-sulphonic acid derivatives hitherto unusable because of bad printing life of the plate.

5 Claims, No Drawings

PHOTOSENSITIVE LITHOGRAPHIC NAPHTHOQUINONE DIAZIDE PRINTING PLATE WITH ALUMINUM BASE

This application is a continuation of U.S. application, Ser. No. 785,782, filed 12/20/1968, now abandoned.

BACKGROUND OF INVENTION

Positive working light-sensitive lithographic printing plates are known and are described for example in U.K. Specification 699,412; 706,028 and 739,654. The sensitive coating of such plates comprises a diazo-oxide derivative. The diazo oxides used in practice are used in combination with alkali-soluble novolak and/or other resins and coated from a solution, onto a metal plate, usually aluminium and have a printing life in the region of 25,000–200,000 copies. These diazo oxides are particular derivatives of naphthoquinone-(1,2)-diazide-(2)-5-sulphonic acid.

Some derivatives of naphthoquinone-(1,2)-diazide-(2)-5-sulphonic acid which appear potentially useful from the point of view of exposure speed, of solubility in organic solvent for the preparation of coating solutions, or of cost due to ease of preparation and/or cheap raw materials, have been found to be very poor in performance, as judged by printing life, because of their poor adhesion to the plate. Printing plates made from these materials usually suffer from disintegration of the image after 100 or even in some cases after only 20 copies have been printed.

There are therefore some derivatives of naphthoquinone-(1,2)-diazide-(2)-5-sulphonic acid which in use give plates having satisfactory printing life, by which we mean a printing life of over 25,000 copies and some which in use give an unsatisfactory printing life, that is less than 25,000 copies.

We have found that the printing life of plates which contain those derivatives which normally yield an unsatisfactory printing life can be improved by the addition of polymeric carboxylic acids to the coating solution, and thus one may by this procedure increase the printing life of the plate so that it is satisfactory and for example gives a printing life of more than 100,000 copies.

The invention therefore provides the advantage that it makes available to the lithographic plate maker a far wider range of diazo-oxides for the production of lithographic plates, by virtue of the fact that use may be made of diazo-oxides which have previously been unsatisfactory in not giving a coating having a satisfactory printing life.

The invention therefore provides a positive-acting lithographic printing plate provided with a coating which includes a naphthoquinone-(1,2)-diazide-(2)-5-sulphonic acid derivative and an alkali-soluble novolak resin in which the coating also includes an amount of a polymeric carboxylic acid effective to impart to the coating a satisfactory printing life as herein defined, such derivative being such as would not give to said coating a satisfactory printing life in the absence of such polymeric carboxylic acid.

Some other derivatives of naphthoquinone-(1,2)-diazide-(2)-5-sulphonic acid have been found to have the relatively poor wear life of 10,000 – 25,000 copies. These have not been improved by the additions of the present invention. It is believed that these compounds possess good adhesion properties in themselves but have poor abrasion resistance.

Those diazo-oxides to which the invention is applicable are those which give an unsatisfactory printing life, that is less than 25,000 copies and often less than 100 copies due to poor adhesion. Whether a particular diazo oxide falls within this class can only be determined by experiment since the property of giving a satisfactory coating in use is not one which appears to be related to chemical structure. Thus, the mono- and bis-sulphonic ester derivatives of 2,3,4-trihydroxybenzophenone are not improved whereas the tris-sulphonic ester derivative shows a great improvement as described in Example 1 below.

In order to ascertain whether a particular compound will be improved by addition of a polymeric carboxylic acid it is only necessary to coat the appropriate material on to a printing plate base and carry out a test on a printing press. If the life is not satisfactory the test is then repeated with the inclusion of a polymeric carboxylic acid in the coating and if a printing life in excess of 25,000 copies results then the diazo-oxide is of a class to which the invention relates.

Examples of specific diazo-oxides which belong to the class to which the invention relates are as follows:

2,3,4-trihydroxy benzophenone tris-[naphthoquinone-(1,2)-diazide-(2)-5-sulphonate]

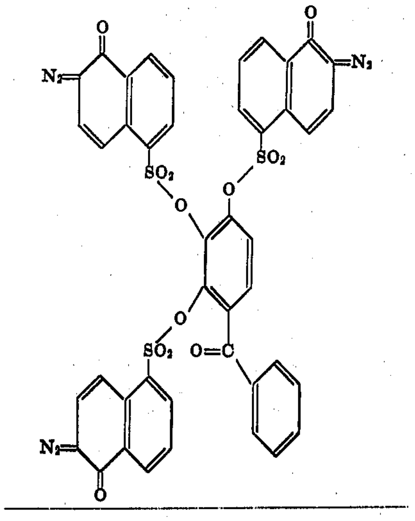

2,4-dihydroxybenzophenone-bis-[naphthoquinone-(1,2)-diazide-(2)-5-sulphonate]

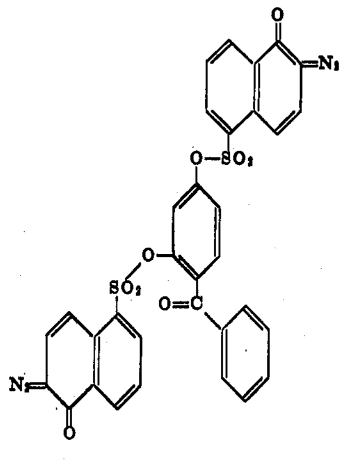

The polymeric carboxylic acids which may be employed in the invention are exemplified by the following materials:

Cellulose Acetate Hydrogen Phthalate. Eastman Kodak Organic Chemicals List No. 4642.

Laropal S. Badische Anilin & Soda Fabrik, A.G.: colophony-containing resin of Acid No. 210 – 240.

Lytron 810; Lytron 820: Monsanto Chemicals Ltd:carboxyl-containing styrene/maleic anhydride copolymers.

Phthalopal PP. Badische Anilin & Soda Fabrik, A.G.: oil-free alkyd resin of Acid No. 180–200.

Phthalopal SEB. Badische Anilin & Soda Fabrik A.G.: phthalate resin, free of fatty acid and of Acid No. 85 – 100.

Poly(vinyl hydrogen phthalate). Eastman Kodak Organic Chemicals List No. 5527.

The amount of polymeric carboxylic acid derivative incorporated in the coating may be varied as desired. Preferably, however, such amount will generally be in the range of 2 – 50 percent by weight based upon the combined weight of the resin and the naphthoquinone-(1,2)-diazide-(2)-5-sulphonic acid derivative.

In order that the invention may be more fully understood, the following Examples are given by way of illustration only:

EXAMPLE 1

A solution of 10 g. 2,3,4-trihydroxy benzophenone tris-[naphthoquinone-(1,2)-diazide-(2)-5-sulphonate] in 100 ml. of 2-ethoxyethanol was added to 200 ml. of a solution of 10 percent Novolak (Pioneer Resin 429K, Fredk. Boehm Ltd.) in 2-ethoxy-ethanol. After filtration the solution was divided into 8 equal parts, to each of which 0.35 g of one of the seven resins listed above was dissolved, leaving one untreated control. After another filtration, each of the solutions in turn was coated on to plates of electro-grained and anodised aluminium using a plate whirler. After drying, all of the plates had coatings of approximately 2 g/m$^2$. After exposure under positive patterns the plates were processed in the usual way using an alkaline developer and mounted in a printing press arranged so as to give an accelerated wear test. The untreated control failed after 20 revolutions owing to poor adhesion of the image to the plate surface. The plates treated according to the invention had by comparison an estimated life of more than 200,000 copies.

EXAMPLE 2

Another experiment was carried out, exactly as above, but using mechanically grained ("scratch-brushed") aluminium plates. The relative results were the same to those of Example 1 but in each case the life was shorter.

EXAMPLE 3

Example 1 was repeated but this time using 2,4-dihydroxy-benzophenone-bis[naphthoquinone-(1,2)-diazide-(2),5-sulphonate]. The results were indistinguishable from those obtained in Example 1.

We claim:

1. A positive-acting light-sensitive material suitable for the production of a lithographic printing plate, comprising a grained aluminum support having a coating which is an admixture of (A) a light-sensitive naphthoquinone-(1,2)-diazide-(2)-5-sulphonic acid ester of a hydroxy benzophenone; and two different resins (B) and (C); in which resin (B) is an alkali-soluble novolak resin; and resin (C) is a polymer containing free carboxylic acid groups; said polymer (C) being present in an amount of from 2 to 50% by weight based on the combined weight of (A) and (B); said amount of (C) being effective to impart to the composition a printing life in excess of 25,000 copies, said composition in the absence of said (C) polymer being capable of a printing life of substantially less than 25,000 copies.

2. The positive-acting light sensitive material of claim 1 in which said (A) is 2,3,4-trihydroxy-benzophenone-tris[naphthoquinone-(1,2)-diazide-(2)-5-sulphonate] or 2,4-dihydroxy-benzophenone-bis-[naphthoquinone-(1,2)-diazide-(2)-5-sulphonate].

3. The positive-acting light-sensitive material of claim 1 wherein (C) is selected from the group consisting of cellulose acetate hydrogen phthalate, collophony-containing resin of acid No. 210 to 240, carboxyl group containing styrene-maleic acid copolymer, oil-free alkyd resin of acid No. 180 to 200, fatty acid-free phthalate resin of acid No. 85 to 100, and poly-(vinyl hydrogen phthalate).

4. The positive-acting light-sensitive material of claim 3 in which (A) is 2,3,4-trihydroxy-benzophenone-tris-[naphthoquinone-(1,2)-diazide-(2)-5-sulphonate].

5. The positive-acting light sensitive material of claim 3, in which (A) is 2,4-dihydroxy-benzophenone-bis-[naphthoquinone-(1,2)-diazide-(2)-5-sulphonate].

* * * * *